(12) United States Patent
Poon

(10) Patent No.: US 12,002,893 B2
(45) Date of Patent: *Jun. 4, 2024

(54) CLUSTERED POWER GENERATOR ARCHITECTURE

(71) Applicant: ENGIE STORAGE SERVICES NA LLC, Santa Clara, CA (US)

(72) Inventor: Ho Shing Abraham Poon, Mountain View, CA (US)

(73) Assignee: ENGIE STORAGE SERVICES NA LLC, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/878,350

(22) Filed: May 19, 2020

(65) Prior Publication Data

US 2020/0280189 A1    Sep. 3, 2020

Related U.S. Application Data

(63) Continuation of application No. 15/650,760, filed on Jul. 14, 2017, now Pat. No. 10,658,841.

(51) Int. Cl.
*H02J 3/00* (2006.01)
*G05B 15/02* (2006.01)
(Continued)

(52) U.S. Cl.
CPC ........ *H01L 31/02008* (2013.01); *G05B 15/02* (2013.01); *G05F 1/67* (2013.01);
(Continued)

(58) Field of Classification Search
None
See application file for complete search history.

(56) References Cited

U.S. PATENT DOCUMENTS 1,831,553 A  11/1931 Byles
4,023,043 A   5/1977 Stevenson
(Continued)

FOREIGN PATENT DOCUMENTS

WO      0111525 A1   2/2001
WO   2017035258 A1   3/2017
(Continued)

OTHER PUBLICATIONS

DOE-2 Engineers Manual, Energy and Environment Division Building Energy Simulation Group, Lawrence Berkeley Laboratory, University of California Berkeley, and Group Q-11 Solar Energy Group, Energy Division, Los Alamos National Laboratory. Nov. 1982.
(Continued)

*Primary Examiner* — Paul B Yanchus, III
(74) *Attorney, Agent, or Firm* — Dorsey & Whitney LLP

(57) ABSTRACT

Multiple dispatchable resources such as energy storage systems, generators, and curtailable loads are used to fulfill electricity usage control instructions by implementing multiple different sets of dispatch instructions. The sets of dispatch instructions vary based on individual status characteristics and aggregate status characteristics of the dispatchable resources in order to use the resources optimally. The resources may in some instances be prioritized according to their status characteristics in order to improve response efficiency, improve cost-effectiveness, reduce errors and flawed fulfillment, and improve the ability of the resources to respond to different kinds of electricity usage control instructions over time.

17 Claims, 6 Drawing Sheets

(51) Int. Cl.
  *G05F 1/67* (2006.01)
  *H01L 31/02* (2006.01)
  *H02J 3/14* (2006.01)
  *H02J 13/00* (2006.01)
  *H04L 67/10* (2022.01)
  *H04L 67/1097* (2022.01)
  *H04L 67/12* (2022.01)
  *H02J 3/32* (2006.01)
  *H02J 7/34* (2006.01)

(52) U.S. Cl.
  CPC .......... *H02J 3/14* (2013.01); *H02J 13/00002* (2020.01); *H04L 67/10* (2013.01); *H04L 67/1097* (2013.01); *H04L 67/12* (2013.01); *H02J 3/00* (2013.01); *H02J 3/32* (2013.01); *H02J 7/34* (2013.01)

(56) References Cited

U.S. PATENT DOCUMENTS

| | | | |
|---|---|---|---|
| 4,059,747 | A | 11/1977 | Brody |
| 4,277,691 | A | 7/1981 | Lunn |
| 4,520,274 | A | 5/1985 | Stants |
| 4,731,547 | A | 3/1988 | Alenduff et al. |
| 5,500,561 | A | 3/1996 | Wilhelm |
| 5,644,173 | A | 7/1997 | Elliason et al. |
| 5,703,442 | A | 12/1997 | Notohamiprodjo et al. |
| 5,798,633 | A | 8/1998 | Larsen et al. |
| 5,816,491 | A | 10/1998 | Berkeley et al. |
| 5,930,773 | A | 7/1999 | Crooks et al. |
| 6,037,758 | A | 3/2000 | Perez |
| 6,067,482 | A | 5/2000 | Shapiro |
| 6,134,124 | A | 10/2000 | Jungreis et al. |
| 6,157,874 | A | 12/2000 | Cooley et al. |
| 6,172,432 | B1 | 1/2001 | Schnackenberg et al. |
| 6,476,519 | B1 | 11/2002 | Weiner |
| 6,522,031 | B2 | 2/2003 | Provanzana et al. |
| 6,542,791 | B1 | 4/2003 | Perez |
| 6,563,048 | B2 | 5/2003 | Holt et al. |
| 6,618,709 | B1 | 9/2003 | Sneeringer |
| 6,652,330 | B1 | 11/2003 | Wasilewski |
| 6,671,586 | B2 | 12/2003 | Davis et al. |
| 6,728,646 | B2 | 4/2004 | Howell et al. |
| 6,785,592 | B1 | 8/2004 | Smith et al. |
| 6,868,293 | B1 | 3/2005 | Schurr et al. |
| 6,882,904 | B1 | 4/2005 | Petrie et al. |
| 6,889,122 | B2 | 5/2005 | Perez |
| 6,900,556 | B2 | 5/2005 | Provanzana et al. |
| 6,902,837 | B2 | 6/2005 | McCluskey et al. |
| 6,977,446 | B2 | 12/2005 | MacKay |
| 7,060,379 | B2 | 6/2006 | Speranza et al. |
| 7,069,161 | B2 | 6/2006 | Gristina et al. |
| 7,122,916 | B2 | 10/2006 | Nguyen et al. |
| 7,132,833 | B2 | 11/2006 | Layden et al. |
| 7,142,949 | B2 | 11/2006 | Brewster et al. |
| 7,171,374 | B1 | 1/2007 | Sheehan et al. |
| 7,193,872 | B2 | 3/2007 | Siri |
| 7,274,975 | B2 | 9/2007 | Miller |
| 7,482,710 | B2 | 1/2009 | Ichinose et al. |
| 7,778,738 | B2 | 8/2010 | Taft |
| 7,782,021 | B2 | 8/2010 | Kelty et al. |
| 7,783,544 | B2 | 8/2010 | Horowitz |
| 7,818,226 | B2 | 10/2010 | Brawley et al. |
| 7,844,529 | B2 | 11/2010 | Ziade et al. |
| 7,863,866 | B2 | 1/2011 | Wolf |
| 7,873,441 | B2 | 1/2011 | Synesiou et al. |
| 7,894,946 | B2 | 2/2011 | Kulyk et al. |
| 7,943,250 | B1 | 5/2011 | Johnson et al. |
| 7,949,615 | B2 | 5/2011 | Ehlers et al. |
| 8,024,077 | B2 | 9/2011 | Torre et al. |
| 8,078,330 | B2 | 12/2011 | Brickfield et al. |
| 8,090,600 | B2 | 1/2012 | Ziade et al. |
| 8,126,794 | B2 | 2/2012 | Lange et al. |
| 8,396,726 | B2 | 3/2013 | Ziade et al. |
| 8,417,391 | B1 | 4/2013 | Rombouts et al. |
| 8,442,698 | B2 | 5/2013 | Fahimi et al. |
| 8,588,989 | B1 | 11/2013 | Heath et al. |
| 8,682,491 | B2 | 3/2014 | Fakos et al. |
| 8,706,650 | B2 | 4/2014 | Ozog |
| 8,761,949 | B2 | 6/2014 | Mansfield |
| 8,761,952 | B2 | 6/2014 | Forbes |
| 8,912,672 | B2 | 12/2014 | Pendray et al. |
| 8,930,269 | B2 | 1/2015 | He et al. |
| 8,983,673 | B2 | 3/2015 | Chow |
| 9,002,670 | B2 | 4/2015 | Hurri et al. |
| 9,003,216 | B2 | 4/2015 | Sankar et al. |
| 9,007,027 | B2 | 4/2015 | Prosser |
| 9,048,671 | B2 | 6/2015 | Prosser |
| 9,235,825 | B2 | 1/2016 | Shao |
| 9,312,698 | B2 | 4/2016 | Subbotin et al. |
| 9,431,827 | B2 | 8/2016 | Chow et al. |
| 9,489,701 | B2 | 11/2016 | Emadi et al. |
| 10,658,841 | B2 * | 5/2020 | Poon ............... H01L 31/02008 |
| 2001/0043013 | A1 | 11/2001 | Abe |
| 2002/0120368 | A1 | 8/2002 | Edelman et al. |
| 2003/0041016 | A1 | 2/2003 | Spool et al. |
| 2003/0055677 | A1 | 3/2003 | Brown et al. |
| 2003/0230443 | A1 | 12/2003 | Cramer et al. |
| 2004/0024483 | A1 | 2/2004 | Holcombe |
| 2004/0084965 | A1 | 5/2004 | Welches et al. |
| 2004/0215529 | A1 | 10/2004 | Foster et al. |
| 2005/0043862 | A1 | 2/2005 | Brickfield et al. |
| 2005/0102068 | A1 | 5/2005 | Pimputkar et al. |
| 2005/0138929 | A1 | 6/2005 | Enis et al. |
| 2006/0017328 | A1 | 1/2006 | Bryde |
| 2006/0276938 | A1 | 12/2006 | Miller |
| 2007/0005192 | A1 | 1/2007 | Schoettle et al. |
| 2007/0061021 | A1 | 3/2007 | Cohen et al. |
| 2007/0103835 | A1 | 5/2007 | Sorenson |
| 2007/0156559 | A1 | 7/2007 | Wolzenski et al. |
| 2008/0046387 | A1 | 2/2008 | Gopal et al. |
| 2008/0114499 | A1 | 5/2008 | Hakim et al. |
| 2008/0167756 | A1 | 7/2008 | Golden et al. |
| 2008/0172312 | A1 | 7/2008 | Synesiou et al. |
| 2008/0183337 | A1 | 7/2008 | Szabados |
| 2008/0191675 | A1 | 8/2008 | Besser et al. |
| 2008/0203975 | A1 | 8/2008 | Burlak et al. |
| 2008/0272934 | A1 | 11/2008 | Wang et al. |
| 2008/0281473 | A1 | 11/2008 | Pitt |
| 2009/0006279 | A1 | 1/2009 | Buettner et al. |
| 2009/0048716 | A1 | 2/2009 | Marhoefer |
| 2009/0088907 | A1 | 4/2009 | Lewis et al. |
| 2009/0157529 | A1 | 6/2009 | Ehlers et al. |
| 2009/0212745 | A1 | 8/2009 | Kelty |
| 2009/0216688 | A1 | 8/2009 | Kelty et al. |
| 2009/0222143 | A1 | 9/2009 | Kempton |
| 2009/0243540 | A1 | 10/2009 | Choi et al. |
| 2009/0254396 | A1 | 10/2009 | Metcalfe |
| 2009/0307117 | A1 | 12/2009 | Greiner et al. |
| 2009/0317694 | A1 | 12/2009 | Ängquist et al. |
| 2010/0017045 | A1 | 1/2010 | Nesler et al. |
| 2010/0023337 | A1 | 1/2010 | Case |
| 2010/0072947 | A1 | 3/2010 | Chan et al. |
| 2010/0114389 | A1 | 5/2010 | Chatterton et al. |
| 2010/0145534 | A1 | 6/2010 | Forbes et al. |
| 2010/0174419 | A1 | 7/2010 | Brumfield et al. |
| 2010/0174643 | A1 | 7/2010 | Schaefer et al. |
| 2010/0217550 | A1 | 8/2010 | Crabtree et al. |
| 2010/0217642 | A1 | 8/2010 | Crubtree et al. |
| 2010/0217645 | A1 | 8/2010 | Jin et al. |
| 2010/0253244 | A1 | 10/2010 | Snook et al. |
| 2010/0262296 | A1 | 10/2010 | Davis et al. |
| 2010/0271802 | A1 | 10/2010 | Recker et al. |
| 2010/0274602 | A1 | 10/2010 | Kaufman et al. |
| 2010/0280978 | A1 | 11/2010 | Shimada et al. |
| 2010/0283606 | A1 | 11/2010 | Tsypin et al. |
| 2010/0286937 | A1 | 11/2010 | Hedley et al. |
| 2010/0295514 | A1 | 11/2010 | Burlak et al. |
| 2010/0301771 | A1 | 12/2010 | Chemel et al. |
| 2010/0301773 | A1 | 12/2010 | Chemel et al. |
| 2010/0324962 | A1 | 12/2010 | Nesler et al. |
| 2010/0327800 | A1 | 12/2010 | Reineccius |
| 2010/0332373 | A1 | 12/2010 | Crabtree et al. |

(56) References Cited

U.S. PATENT DOCUMENTS

| | | |
|---|---|---|
| 2011/0004358 A1 | 1/2011 | Pollack et al. |
| 2011/0022419 A1 | 1/2011 | Ziade et al. |
| 2011/0035061 A1 | 2/2011 | Altonen et al. |
| 2011/0040666 A1 | 2/2011 | Crabtree et al. |
| 2011/0046806 A1 | 2/2011 | Nagel et al. |
| 2011/0046904 A1 | 2/2011 | Souilmi |
| 2011/0082598 A1 | 4/2011 | Boretto et al. |
| 2011/0133655 A1 | 6/2011 | Recker et al. |
| 2011/0137481 A1 | 6/2011 | Manz et al. |
| 2011/0166710 A1 | 7/2011 | Kordik et al. |
| 2011/0173109 A1 | 7/2011 | Synesiou et al. |
| 2011/0184574 A1 | 7/2011 | Roux et al. |
| 2011/0193518 A1 | 8/2011 | Wright et al. |
| 2011/0196692 A1 | 8/2011 | Chavez et al. |
| 2011/0204720 A1 | 8/2011 | Ruiz et al. |
| 2011/0208369 A1 | 8/2011 | Yang et al. |
| 2011/0231320 A1 | 9/2011 | Irving |
| 2011/0251933 A1 | 10/2011 | Egnor et al. |
| 2011/0301894 A1 | 12/2011 | Sanderford |
| 2011/0309799 A1 | 12/2011 | Firehammer |
| 2012/0010757 A1 | 1/2012 | Francino et al. |
| 2012/0016528 A1 | 1/2012 | Raman et al. |
| 2012/0029720 A1 | 2/2012 | Cherian et al. |
| 2012/0035777 A1 | 2/2012 | Park |
| 2012/0059607 A1 | 3/2012 | Rebec et al. |
| 2012/0061963 A1 | 3/2012 | Thisted |
| 2012/0065789 A1 | 3/2012 | Scelzi et al. |
| 2012/0065792 A1 | 3/2012 | Yonezawa et al. |
| 2012/0074780 A1 | 3/2012 | Fleck |
| 2012/0083930 A1 | 4/2012 | Ilic et al. |
| 2012/0101639 A1 | 4/2012 | Carralero et al. |
| 2012/0101921 A1 | 4/2012 | Anderson et al. |
| 2012/0130556 A1 | 5/2012 | Marhoefer |
| 2012/0185105 A1 | 7/2012 | McMullin |
| 2012/0197452 A1 | 8/2012 | Matthews et al. |
| 2012/0242148 A1 | 9/2012 | Galati |
| 2012/0245744 A1 | 9/2012 | Prosser et al. |
| 2012/0245751 A1 | 9/2012 | Gow et al. |
| 2012/0310416 A1 | 12/2012 | Tepper et al. |
| 2013/0018821 A1 | 1/2013 | Shao |
| 2013/0024342 A1 | 1/2013 | Horowitz et al. |
| 2013/0030590 A1 | 1/2013 | Prosser |
| 2013/0030595 A1 | 1/2013 | Chow et al. |
| 2013/0047010 A1 | 2/2013 | Massey et al. |
| 2013/0060719 A1 | 3/2013 | Burke et al. |
| 2013/0085614 A1 | 4/2013 | Wenzel et al. |
| 2013/0117004 A1 | 5/2013 | Schultz et al. |
| 2013/0134780 A1 | 5/2013 | Parsonnet |
| 2013/0173191 A1 | 7/2013 | McDonald et al. |
| 2013/0190939 A1 | 7/2013 | Lenox |
| 2013/0226544 A1 | 8/2013 | Mcconaghy et al. |
| 2013/0232151 A1 | 9/2013 | Shao |
| 2013/0271083 A1 | 10/2013 | Williams |
| 2013/0274935 A1 | 10/2013 | Deshpande et al. |
| 2013/0285610 A1 | 10/2013 | Katou et al. |
| 2013/0297092 A1 | 11/2013 | Willig et al. |
| 2013/0325197 A1 | 12/2013 | Mansfield |
| 2014/0019171 A1 | 1/2014 | Koziol |
| 2014/0039710 A1 | 2/2014 | Carter et al. |
| 2014/0067140 A1 | 3/2014 | Gow |
| 2014/0070756 A1 | 3/2014 | Kearns et al. |
| 2014/0074306 A1 | 3/2014 | Lu et al. |
| 2014/0122906 A1 | 5/2014 | Whitted et al. |
| 2014/0152007 A1 | 6/2014 | Sterregaard et al. |
| 2014/0163755 A1 | 6/2014 | Potter et al. |
| 2014/0379160 A1 | 12/2014 | Fallon |
| 2015/0015213 A1 | 1/2015 | Brooks et al. |
| 2015/0025917 A1 | 1/2015 | Stempora |
| 2015/0094965 A1 | 4/2015 | Schneider et al. |
| 2015/0295449 A1 | 10/2015 | Prosser |
| 2016/0006245 A1 | 1/2016 | Chow |
| 2016/0020613 A1* | 1/2016 | Kimura ............... H02J 3/32 307/52 |
| 2016/0055412 A1 | 2/2016 | Carroll et al. |
| 2016/0075247 A1* | 3/2016 | Uyeki ............... B60L 55/00 455/456.3 |
| 2016/0161932 A1 | 6/2016 | Shao |
| 2016/0360336 A1 | 12/2016 | Gross et al. |
| 2017/0045902 A1 | 2/2017 | Patil et al. |
| 2017/0060162 A1 | 3/2017 | Holzman et al. |
| 2017/0063083 A1 | 3/2017 | Holzman |
| 2017/0098229 A1 | 4/2017 | Vickery et al. |
| 2017/0098279 A1 | 4/2017 | Vickery et al. |
| 2017/0099056 A1 | 4/2017 | Vickery et al. |
| 2017/0102726 A1 | 4/2017 | Goldsmith |
| 2017/0133865 A1* | 5/2017 | Chiueh ............... H02J 7/0068 |
| 2017/0243139 A1 | 8/2017 | Dzierwa et al. |
| 2017/0271891 A1* | 9/2017 | Keates ............... H02J 7/0019 |
| 2017/0324256 A1 | 11/2017 | Mcmorrow et al. |
| 2017/0331290 A1 | 11/2017 | Burlinson et al. |
| 2018/0342867 A1 | 11/2018 | Poon |
| 2018/0358835 A1 | 12/2018 | Tian et al. |
| 2019/0020196 A1 | 1/2019 | Poon |

FOREIGN PATENT DOCUMENTS

| | | |
|---|---|---|
| WO | 2017040586 A1 | 3/2017 |
| WO | 2017059340 A1 | 4/2017 |
| WO | 2017059345 A1 | 4/2017 |
| WO | 2017059350 A1 | 4/2017 |

OTHER PUBLICATIONS

Jeon et al., "Using deferrable demand in a smart grid to reduce the cost of electricity for customers", Journal of Regulatory Economics, Springer Science+Business Media New York. (Year:2015).

Johnson et al., "Renewable Generation Capacity and Wholesale Electricity Price Variance", Energy Journal, International Association for Energy Economics, Inc. (Year: 2019).

Load aggregation of multiple facilities, Application Note #7, Obvius, 4 pages, Hillsboro, OR, published at "http://www.obvius.com/applicationnotes.php".

Load Curtailment/Demand Response, Application Note #3, Obivus, 4 pages, Hillsboro, OR, published at "http://www.obvius.com/applicationnotes.php".

PCT International Search Report for corresponding PCT International Patent Application No. PCT/US2016/048448, dated Nov. 18, 2016.

PCT International Search Report for corresponding PCT International Patent Application No. PCT/US2016/049587, dated Nov. 15, 2016.

PCT International Search Report for corresponding PCT International Patent Application No. PCT/US2016/054965, dated Nov. 16, 2016.

PCT International Search Report for corresponding PCT International Patent Application No. PCT/US2016/054973, dated Nov. 16, 2016.

PCT International Search Report for corresponding PCT International Patent Application No. PCT/US2016/054983, dated Nov. 16, 2016.

Norris et al., "NAS Battery Demonstration at American Electric Power: A Study for the DOE Energy Storage Program", "NAS Battery Demonstration at American Electric Power: A Study for the DOE Energy Storage Program." Sandia National Laboratories, Mar. 2007, 55 pgs.

Pedrasa et al., "Robust Scheduling of Residential Distributed Energy Resources Using a Novel Energy Service Decision-Support Tool", Innovative Smart Grid Technologies (ISGT), IEEE PES, pp. 1-8.

Craft, D., "Local Energy Management Through Mathematical Modeling and Optimization", Massachusetts Institute of Technology Doctorate Thesis, Sep. 1, 2004 00:00:00.0, 223 Pgs.

Iman, R. et al., "A Distribution-Free Approach to Inducing Rank Correlation Among Input Variables", Communications in Statistics—Stimulation and Computation, vol. 11, Iss. 3, Jan. 1, 1982 00:00:00. 0, pp. 311-334.

Stylianos I. Vagropoulos, Anastasios G. Bakirtzis, "Optimal Bidding Strategy for Electric Vehicle Aggregators in Electricity Markets", IEEE Transactions on Power Systems, vol. 28, No. 4, Nov. 2013, 2013, 4031-4041.

(56) References Cited

OTHER PUBLICATIONS

Dang, J. et al., "ISEEE Journal of Emerging and Selected Topics in Power Electronics, vol. 2, No. 1, Mar. 2014—SOC Feedback Control for Wind and ESS Hybrid Power System Frequency Regulation", Mar. 2014.

Hussein, Ala A. et al., "IEEE Transactions on Sustainable Energy, vol. 3, No. 3, Jul. 2012—Distributed Battery Micro-Storage Systems Design and Operation in a Deregulated Electricity Market", Jul. 3, 2012.

Gaylord, Chris "40-80 rule: New tip for extending battery life" https://web.archive.org/web/20150514231058/https://www.csmonitor.com/Technology/Tech/2014/01-3/40-80-rule-New-tip-for-extending-battery-life published Jan. 2014, retrieved Mar. 2022.

* cited by examiner

CLUSTERED POWER GENERATOR ARCHITECTURE

CROSS-REFERENCE TO RELATED APPLICATION

This application is a continuation of U.S. patent application Ser. No. 15/650,760, filed 14 Jul. 2017, now issued as U.S. Pat. No. 10,658,841 on May 19, 2020, the disclosure of which is incorporated by reference herein in its entirety.

TECHNICAL FIELD

The present disclosure generally relates to systems and methods for controlling a plurality of dispatchable electrical resources in load management and curtailment.

BACKGROUND

Electrical energy and power generation and distribution has been a mainstay for residential and commercial energy needs all over the world and for many years. Various forms of electrical energy generation have been devised, including coal fired power plants, nuclear power plants, hydroelectric plants, wind harness plants, and others. All of these forms of electrical energy generation are well known to those of skill in the art of power generation.

As power generation has advanced, power usage has increased. Due to advances in technology and cultural factors, the demand for electrical energy steadily rises. Energy production facilities and distributors such as electrical utility providers therefore meet the rising demand for electricity with greater production capabilities. However, utility providers do not need to provide the same maximum capacity of electrical power production to consumers at all times. Consumer needs greatly fluctuate based on the time of day, time of year, and other related factors. Therefore, utility providers have implemented programs wherein they charge more per watt-hour of energy consumed during predetermined periods of time when overall consumer demand is expected to be higher than usual. These programs are referred to herein as "time-of-use" energy billing programs. These programs help the providers offset their costs of operating peaking power plants that are primarily brought online during those high-demand periods of time. The price increases are not typically directly associated with the activity of any single consumer.

Utility providers have also implemented programs to charge individual consumers for consuming energy at high power levels without being dependent on the levels of others' simultaneous consumption. Under these programs, the consumer is billed a "demand charge" that is based on and directly related to the highest magnitude of power drawn from the grid at some point during a billing period. Therefore, these programs are referred to herein as "demand charge" energy billing programs.

Some customers participate in demand response programs wherein a utility provider provides compensation when the customers curtail their consumption or provide power to the grid when requested by the provider. During periods of high grid load, demand response signals may be sent to participating customers to reduce consumption or provide power to the grid at certain magnitudes or over certain periods of time. Customers may be penalized for failing to provide the necessary response when requested. Utility consumers are therefore constantly in need of advancements in technology that can help them reduce costs, optimize their equipment, or improve the efficiency of their consumption.

SUMMARY

One aspect of the present disclosure relates to a method of managing a plurality of dispatchable electrical resources. The method may comprise receiving electricity usage control instructions at a site of a utility customer, with the site having a plurality of dispatchable electrical resources. The method may also include receiving individual status characteristics of each of the plurality of dispatchable electrical resources at the site, receiving aggregate status characteristics of the plurality of dispatchable electrical resources, determining a power dispatching mode to fulfill the electricity usage control instructions using the plurality of dispatchable electrical resources based on the individual status characteristics and the aggregate status characteristics, and implementing the power dispatching mode by sending dispatch instructions to the plurality of dispatchable electrical resources. A first set of dispatch instructions may be sent to a first portion of the plurality of dispatchable electrical resources, and a second set of dispatch instructions may be sent to a second portion of the plurality of dispatchable electrical resources. The first portion of the plurality of dispatchable electrical resources may perform a first task in response to receiving the first set of dispatch instructions, and the second portion of the plurality of dispatchable electrical resources may perform a second task in response to receiving the second set of dispatch instructions, with the first task being unique relative to the second task.

In some embodiments, at least one of the first and second sets of dispatch instructions may prioritize dispatching the first portion of the plurality of dispatchable electrical resources over the second portion of the plurality of dispatchable electrical resources. In this case, the method may also comprise adjusting the prioritization of the first and second portions of the plurality of dispatchable electrical resources over time. In some arrangements, the method may further comprise adjusting the prioritization of the first and second portions of the plurality of dispatchable electrical resources after sending a predetermined quantity of dispatch instructions.

The method may in some cases comprise adjusting the prioritization of the first and second portions of the plurality of dispatchable electrical resources after at least one of the first and second portions of the plurality of dispatchable electrical resources have performed a predetermined quantity of load cycles. The first portion of the plurality of dispatchable electrical resources may comprise a first power capacity and the second portion of the plurality of dispatchable electrical resources may comprise a second power capacity, wherein the first and second sets of dispatch instructions may be weighted by the first and second power capacities of the first and second portions of the plurality of dispatchable electrical resources.

The first set of dispatch instructions may comprise directions to provide power from the first portion of the plurality of dispatchable electrical resources at a first power level, and the second set of dispatch instructions may comprise instructions to provide power from the second portion of the plurality of dispatchable electrical resources at a second power level. The first power level may be weighted by a first maximum power capacity of the first portion of the plurality of dispatchable electrical resources, and the second power level may be weighted by a second maximum power capacity of the second portion of the plurality of dispatchable electrical resources.

The individual status characteristics may in some arrangements include maximum power efficiency characteristics, in which cases the first and second sets of dispatch instructions may prioritize dispatching energy from dispatchable electrical resources having highest maximum power efficiency characteristics. Also, the individual status characteristics may include maximum charging power for each of the plurality of dispatchable electrical resources, wherein the first and second sets of dispatch instructions may prioritize dispatching energy from dispatchable electrical resources having the highest maximum charging power.

The individual status characteristics may include maximum discharging power for each of the plurality of dispatchable electrical resources. Thus, the first and second sets of dispatch instructions may prioritize dispatching energy from dispatchable electrical resources having highest maximum discharging power. The individual status characteristics may also include an amount of charge provided by a renewable energy source to each of the plurality of dispatchable electrical resources, wherein the first and second sets of dispatch instructions may prioritize charging dispatchable electrical resources when charging is available from the renewable energy source.

In some embodiments, the first and second sets of dispatch instructions may preserve a minimum energy capacity of the plurality of dispatchable electrical resources. The electricity usage control instructions may comprise instructions to prevent power from being dispatched from the plurality of dispatchable electrical resources to loads outside a micro-grid. The electricity usage control instructions may comprise instructions to at least temporarily suppress demand of a load.

Another aspect of the disclosure relates to a non-transitory computer-readable medium storing code for managing a plurality of dispatchable electrical resources. The code may comprise directions executable by a processor to: receive electricity usage control instructions at a site of a utility customer, with the site having a plurality of dispatchable electrical resources, receive individual status characteristics of each of the plurality of dispatchable electrical resources at the site, receive aggregate status characteristics of the plurality of dispatchable electrical resources, determine a power dispatching mode to fulfill the electricity usage control instructions using the plurality of dispatchable electrical resources based on the individual status characteristics and the aggregate status characteristics, and implement the power dispatching mode by sending dispatch instructions to the plurality of dispatchable electrical resources. A first portion of the plurality of dispatchable electrical resources may thereby be instructed to perform a first set of dispatch instructions, and a second portion of the plurality of dispatchable electrical resources may be instructed to perform a second set of dispatch instructions. The first and second sets of dispatch instructions may be unique relative to each other.

In some embodiments, at least one of the first and second sets of dispatch instructions may prioritize dispatching the first portion of the plurality of dispatchable electrical resources over the second portion of the plurality of dispatchable electrical resources. The directions may further comprise adjusting the prioritization of the first and second portions of the plurality of dispatchable electrical resources over time. The first and second sets of dispatch instructions may be weighted proportional to the individual status characteristics of the first and second portions of the plurality of dispatchable electrical resources.

Another aspect of the disclosure relates to an apparatus for managing a plurality of dispatchable electrical resources. The apparatus may comprise a processor, memory in electronic communication with the processor, and directions stored in the memory, with the directions being executable by the processor to receive electricity usage control instructions at a site of a utility customer, with the site having a plurality of dispatchable electrical resources. The directions may also be executable by the processor to receive individual status characteristics of each of the plurality of dispatchable electrical resources at the site, receive aggregate status characteristics of the plurality of dispatchable electrical resources, determine a power dispatching mode to fulfill the electricity usage control instructions using the plurality of dispatchable electrical resources based on the individual status characteristics and the aggregate status characteristics, generate unique sets of instructions to control the plurality of dispatchable electrical resources based on the power dispatching mode, and perform the unique sets of instructions using the plurality of dispatchable electrical resources. In that case, a first portion of the plurality of dispatchable electrical resources may be configured to perform a first unique set of instructions of the unique sets of instructions, and a second portion of the plurality of dispatchable electrical resources may be configured to perform a second unique set of instructions of the unique sets of instructions.

At least one of the first and second sets of dispatch instructions may prioritize dispatching the first portion of the plurality of dispatchable electrical resources over the second portion of the plurality of dispatchable electrical resources. The directions may also further comprise adjusting the prioritization of the first and second portions of the plurality of dispatchable electrical resources over time. In some embodiments, the first and second sets of dispatch instructions may be weighted proportional to the individual status characteristics of the first and second portions of the plurality of dispatchable electrical resources.

The above summary of the present invention is not intended to describe each embodiment or every implementation of the present invention. The figures and the detailed description that follow more particularly exemplify one or more preferred embodiments.

BRIEF DESCRIPTION OF THE DRAWINGS

The accompanying drawings and figures illustrate a number of exemplary embodiments and are part of the specification. Together with the present description, these drawings demonstrate and explain various principles of this disclosure. A further understanding of the nature and advantages of the present invention may be realized by reference to the following drawings. In the appended figures, similar components or features may have the same reference label.

Figure 1:
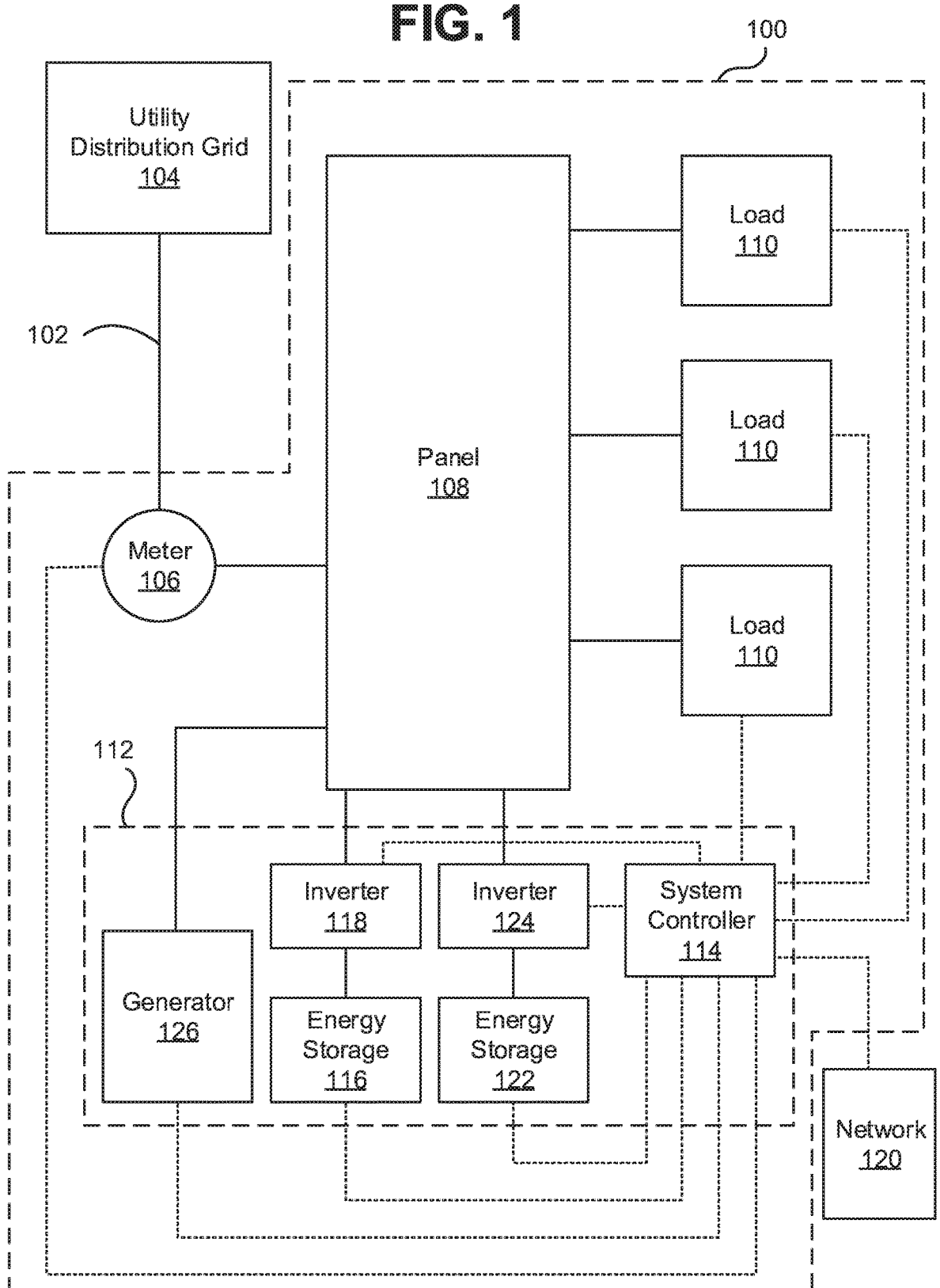
FIG. 1 is a schematic diagram illustrating a utility consumer site according to an embodiment of the present disclosure.

While the embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION

Customers respond to the assessment of high demand charges and participate in demand response programs by implementing load management systems at their sites. These systems may provide load shedding (e.g., temporary disconnecting or reducing consumption of loads), supplemental electricity generation (e.g., fuel-based or renewable generators), and energy storage (e.g., batteries and capacitors) for load control when they are needed to prevent load from rising (thereby preventing demand charges) or to limit consumption and provide power (when required in a demand response program). For example, the resources of the systems may generate power using generators, provide energy by discharging energy storage devices, curtail consumption of loads, and increase consumption by charging energy storage devices on command. These electrical resources may be referred to as being "dispatchable" electrical resources since they may be dispatched or activated to change the electrical consumption or generation at the site in response to load curtailment controller commands.

At sites that have many different dispatchable resources, conventional system controllers are designed to manage all of the resources by treating them in a generally equal manner. However, these controllers introduce significant efficiency losses and errors into the fulfillment of electrical control instructions when many different kinds of resources are used for the same purposes or while they implement identical dispatch instructions. Accordingly, there is a need for improvements and innovation in the field of electrical utility usage mitigation and optimization.

Conventional system controllers are not adaptable to different operating conditions of the electrical resources. When a demand response command is received from a utility provider, the controllers may dispatch inefficient or unrealistic commands to the electrical resources, such as sending commands to discharge energy storage resources that are already depleted or are in a state that would cause their discharge to be inefficient (e.g., they are at a high temperature or are nearing the end of their working life). These inefficiencies and unrealistic commands may introduce error into the demand response provided by the customer and may lead to missing curtailment commands and penalties from the utility provider. Likewise, when power draw for the site approaches a demand charge setpoint threshold, the system controller may attempt to prevent incursion of new or additional demand charges by managing power consumption at the site using the dispatchable resources. If there are errors and inefficiencies in the commands, however, power draw of the site may get out of control, energy storage or generation may not be able to mitigate the power draw effectively, and unnecessary demand charges may accrue.

Accordingly, the present disclosure relates generally to systems and methods for managing a plurality of dispatchable electrical resources. In some embodiments, the plurality of dispatchable electrical resources may refer to a plurality of different types of electrical resources (e.g., generators, energy storage, curtailable or otherwise controllable loads, and the like), may refer to a plurality of electrical resources that are the same or essentially the same in type (e.g., a plurality of energy storage devices) that each have different characteristics (e.g., different numbers of load cycles, different states of charge, different capacities, and the like), or may refer to a combination of different types of resources and different resources of the same type or the essentially same type.

In some embodiments, the systems and methods may help to identify and use dispatchable resources that are suited to be efficiently used to react to different types of demand response or demand charge management activities. An example method may comprise receiving electricity usage control instructions at a site of an energy consumer. In some configurations, the instructions may comprise demand response or demand charge management requirements, such as requirements to reduce power draw of the site for a duration of time or to reduce or increase the power draw for the site by a specified magnitude.

The example method may further include receiving aggregate status characteristics of a plurality of energy storage resources at the site and receiving individual status characteristics of each of the plurality of energy storage resources. The status characteristics may comprise electrical, chemical, and physical characteristics of the resources, such as, for example, current state of charge (SOC) or fuel status, number of cycles, current available capacity or power (e.g., in kWh or kW), total capacity, resource health, age, energy discharged over the device's lifetime (e.g., in MWh), location, connection type, generator or energy storage type, startup speed, temperature, reactive charge power (e.g., in kVAr), real discharge power (e.g., in kVAr), maximum or minimum input or output voltage, efficiency profile information (e.g., percent efficiency versus power), maximum charge or discharge profile (e.g., power versus SOC), sampling period, soft maximum or minimum SOC, and related information.

The method may also include determining a power dispatching mode to complete the electricity usage control instructions using the plurality of energy storage resources. As used herein a dispatchable resource is "dispatched" by being controlled by a controller (e.g., system controller 114 or controller network 200) to charge, discharge, adjust its consumption, or otherwise become activated to fulfill the electricity usage control instructions. If dispatch instructions include prioritizing dispatch of some first resources over other second resources, this may refer to dispatching the first resources before dispatching the second resources, dispatching the first resources at a greater magnitude of energy transfer than the second resources, dispatching the first resources for a longer duration than the second resources, and other similar activities.

The power dispatching mode may be tailored to the status and characteristics of the resources available. The power dispatching mode may be implemented by sending dispatch instructions to portions of the plurality of energy storage resources, wherein a first portion of the plurality of energy storage resources is instructed to perform a first set of dispatch instructions and a second portion of the plurality of energy storage resources is instructed to perform a second set of dispatch instructions that is different from the first set.

For example, each of the electrical resources may comprise a controller to which dispatch instructions are sent. Accordingly, the method may treat various portions of the plurality of energy storage resources differently in order to improve efficiency and avoid errors in satisfying the electricity usage control instructions. For example, some of the energy storage resources may have a higher power capacity than other resources, so the higher power capacity resources may be provided with dispatch instructions to provide higher power than the other resources.

The present description provides examples, and is not limiting of the scope, applicability, or configuration set forth in the claims. Thus, it will be understood that changes may be made in the function and arrangement of elements discussed without departing from the spirit and scope of the disclosure, and various embodiments may omit, substitute, or add other procedures or components as appropriate. For instance, the methods described may be performed in an order different from that described, and various steps may be added, omitted, or combined. Also, features described with respect to certain embodiments may be combined in other embodiments.

Additional detail and embodiments will be provided with reference to the figures. FIG. 1 illustrates a utility consumer site 100 having a connection 102 to a utility distribution grid 104 through a utility meter 106. A utility connection panel 108 may facilitate connection of a plurality of loads 110 at the site 100 to the meter 106. Thus, the loads 110 may receive power from the grid 104 through the meter 106 and the panel 108.

The site 100 may have a consumption management system 112 connected to the meter 106, panel 108, and/or loads 110. The consumption management system 112 may alternatively be referred to as a load control system, load curtailment system, demand response system, or demand charge management system. The consumption management system 112 may comprise a system controller 114 in electronic communication with a first energy storage system (ESS) 116, a first inverter 118 (or other converter apparatus), a second energy storage system 122, a second inverter 124, and a generator 126. The consumption management system 112 may have a wired or wireless connection to any of the other components at the site 100. In FIG. 1, the consumption management system 112 is shown with solid connection lines indicating an electrical load-bearing connection between components and dashed connection lines indicating a signal-bearing connection between components. In some arrangements, signals and loads may be transferred through the same electrical lines between components. In some embodiments, a plurality of consumption management systems 112 may be connected at the site 100. Accordingly, the consumption management system 112 may be representative of one of many systems at the site 100. The first energy storage system 166 and first inverter 118 may collectively be referred to as a first dispatchable energy resource, the second energy storage system 122 and second inverter 124 may be collectively referred to as a second dispatchable energy resource, and the generator 126 may be referred to as a third dispatchable energy resource. In some embodiments, the first, second, and third dispatchable energy resources may each respectively further comprise a controller (e.g., resource controllers 204, 206, 208 in FIG. 2).

The system controller 114 may receive information from the meter 106, loads, 110, the first, second, and third dispatchable electrical resources, and any other components at the site 100. The system controller 114 may also have a connection to a network 120 such as, for example, the Internet, via a network connection or other transceiver apparatus. The system controller 114 may therefore be in one-way or two-way connection with a remote location to report information or receive instructions. For example, electricity usage control instructions may be transmitted to the system controller 114 using the connection to the network 120. In some cases, the electricity usage control instructions may be provided from a demand charge setpoint management controller or from a utility provider's system. The system controller 114 may comprise a computing device configured to send and receive electronic signals and to execute instructions stored in a memory device using a processor. See also FIGS. 2-3 and their associated descriptions herein.

The energy storage systems 116, 122 may alternatively be referred to as load curtailment devices or energy storage devices. The energy storage systems 116, 122 may each comprise a storage device for electrical energy, such as, for example, a battery bank, capacitor bank, flywheel system, or other related energy storage system capable of being charged by electrical energy and discharged to provide electrical energy.

The inverters 118, 124 may each link their respective energy storage system 116, 122 to the panel 108 or otherwise to the grid 104. For example, the inverter 118 may comprise a two-way DC-AC inverter that allows the energy storage 116 to provide AC power to the panel 108 or to charge the energy storage 116 with DC power. In some embodiments, converters other than an inverter may be used, or the inverter 118 may be omitted, depending on the electrical system being used at the site 100.

In some arrangements, the energy storage systems 116, 122 may each comprise a plurality of different energy storage systems that are each individually and separately connected to the system controller 114 and/or inverter(s) 118, 124. Multiple energy storage systems may be connected to a single inverter or each may be connected to its own inverter or other converter. Accordingly, the energy storage systems 116, 122 and inverters 118, 124 are shown here for example purposes, but other potential devices and combinations of devices may be used by those having skill in the art to implement the functions and features of embodiments of the present disclosure.

The generator 126 may comprise a fuel-based generator (e.g., a gasoline or diesel powered generator), a renewable energy generator (e.g., a solar array or wind-powered generator), or other device configured to generate electrical power. The generator 126 may comprise a plurality of different generators that are each individually and separately connected to the system controller 114, but only one generator is shown in the block diagram of FIG. 1. Each of the plurality of different generators may be part of a unique dispatchable electrical resource connected to the system controller 114.

The energy storage systems 116, 122 may be charged to draw energy from the utility distribution grid 104 or may be discharged to provide energy to the utility distribution grid 104. When charging, the energy storage systems 116, 122 may increase the consumption recorded from the grid 104 at the meter 106, and when discharging, the energy storage systems 116, 122 may decrease consumption recorded from the grid 104 via the meter 106. In this manner, discharging the energy storage systems 116, 122 may reduce the recorded power draw of the site 100 (e.g., the recorded power draw of the loads 110 from the grid 104) that would be used to determine a demand charge for the consumer.

Charging the energy storage systems 116, 122 may increase the recorded power draw of the site 100.

Thus, when the instantaneous or average power draw of the site within a billing period exceeds a predetermined setpoint, at least one of the energy storage systems 116, 122 or the generator 126 may be discharged to drive down and reduce the instantaneous or average power draw. If the instantaneous or average power draw is below the setpoint, at least one of the energy storage systems 116, 122 may be charged from the grid 104 in a manner that drives up the power draw without causing the average to exceed the setpoint so that the energy storage systems 116, 122 may later continue discharging operations without depleting.

Figure 2:
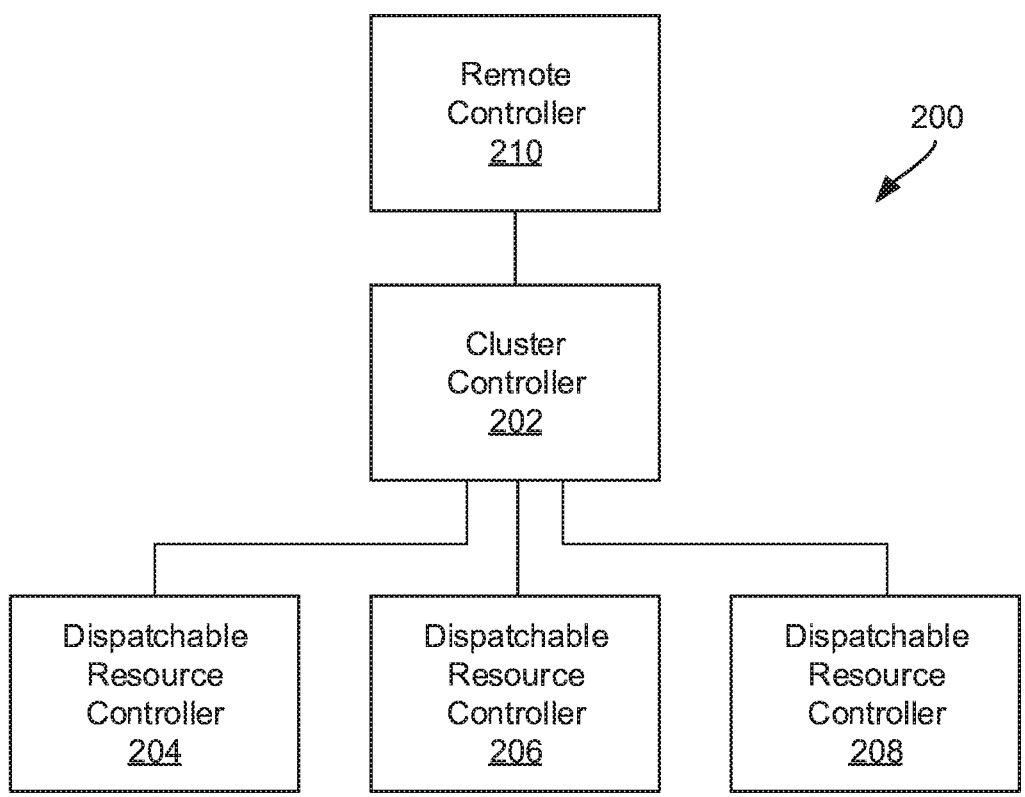
FIG. 2 is a schematic diagram illustrating a controller network according to an embodiment of the present disclosure.

As described above, in some embodiments, each dispatchable electrical resource may comprise or may be connected to its own separate controller. Thus, the system controller 114 of FIG. 1 may be connected to a plurality of separate controllers. FIG. 2 illustrates an example embodiment wherein a controller network 200 comprises a cluster controller 202 connected to a plurality of individual dispatchable resource controllers 204, 206, 208. The system controller 114 of FIG. 1 may represent at least the cluster controller 202 of FIG. 2. In some cases, the system controller 114 may represent the cluster controller 202 and the dispatchable resource controllers 204, 206, 208.

The dispatchable resource controllers 204, 206, 208 may each be connected to a separate dispatchable resource (e.g., generator 126, inverter 118 and energy storage system 116, and inverter 124 and energy storage system 122, respectively), and may each implement instructions provided by the cluster controller 202. For example, dispatchable resource controller 204 may control the operation of the generator 126, dispatchable resource controller 206 may control the operation of energy storage system 116 and inverter 118, and dispatchable resource controller 208 may control the operation of energy storage system 122 and inverter 124. Each of the dispatchable resource controllers 204, 206, 208 may operate independently and may perform different instructions. In some cases, the cluster controller 202 may provide a single set of instructions to each of the dispatchable resource controllers 204, 206, 208, but that single set of instructions may contain a set of unique instructions for each of the resource controllers 204, 206, 208 to fulfill (i.e., each controller's instructions are unique relative to each other). In other cases, the sets of instructions provided to each of the resource controllers 204, 206, 208 may each be entirely unique relative to each other. For example, one resource controller 204 may receive a first set of instructions specifically tailored to the generator 126, another resource controller 206 may receive a second set of instructions specifically tailored to the energy storage system 116 and inverter 118, and yet another controller 208 may receive a third set of instructions specifically tailored to the energy storage system 122 and inverter 124. Alternatively, all three resource controllers 204, 206, 208 may receive a set of instructions that contains instructions for each of the generator 126, ESS 116/inverter 118, and ESS 122/inverter 124, and each of the resource controllers 204, 206, 208 may be configured to execute the instructions in the set that apply to their respective dispatchable resources. Each type of dispatchable resource may be directed to complete a different task or a task having a unique nature, such as generators being directed to perform a power generating task or energy storage being directed to perform a charging or discharging task. In some cases, dispatchable resources having the same type (e.g., two energy storage resources) may be directed to perform a unique task such as one ESS discharging and the other ESS charging. In another example, one ESS may be directed to perform a task of discharging a first amount of energy or at a first power level, and the other ESS may perform a unique task of discharging a second amount of energy or at a second power level. Thus, in some embodiments, the tasks or functions in the control directions sent to the dispatchable resources may differ in nature, magnitude, or duration.

The cluster controller 202 may comprise a computing device separate from the dispatchable resource controllers 204, 206, 208. Thus, the cluster controller 202 may implement logic and programming that is not implemented by the dispatchable resource controllers 204, 206, 208. For instance, the cluster controller 202 may receive data from the dispatchable resource controllers 204, 206, 208 regarding status characteristics of their respective dispatchable resources. The cluster controller 202 may also determine how efficiently the dispatchable resource controllers 204, 206, 208 are operating and performing the instructions. The cluster controller 202 may implement logic and algorithms for determining which dispatch instructions are sent to each dispatchable resource controller 204, 206, 208. In some cases, this may include prioritizing each of the dispatchable resources based on their status characteristics and using the dispatchable resources differently as a result. Thus, the controller network 200 may comprise a hierarchical structure wherein a cluster controller 202 exchanges information with the dispatchable resource controllers 204, 206, 208 while managing how they are instructed to operate.

In some embodiments, the cluster controller 202 may receive instructions from a remote controller 210, such as, for example, via a network 120 (see FIG. 1). In some arrangements, the cluster controller 202 receives electricity usage control instructions from the remote controller 210 and then implements the electricity usage control instructions using the dispatchable resource controllers 204, 206, 208 and their respective dispatchable resources.

Figure 3:
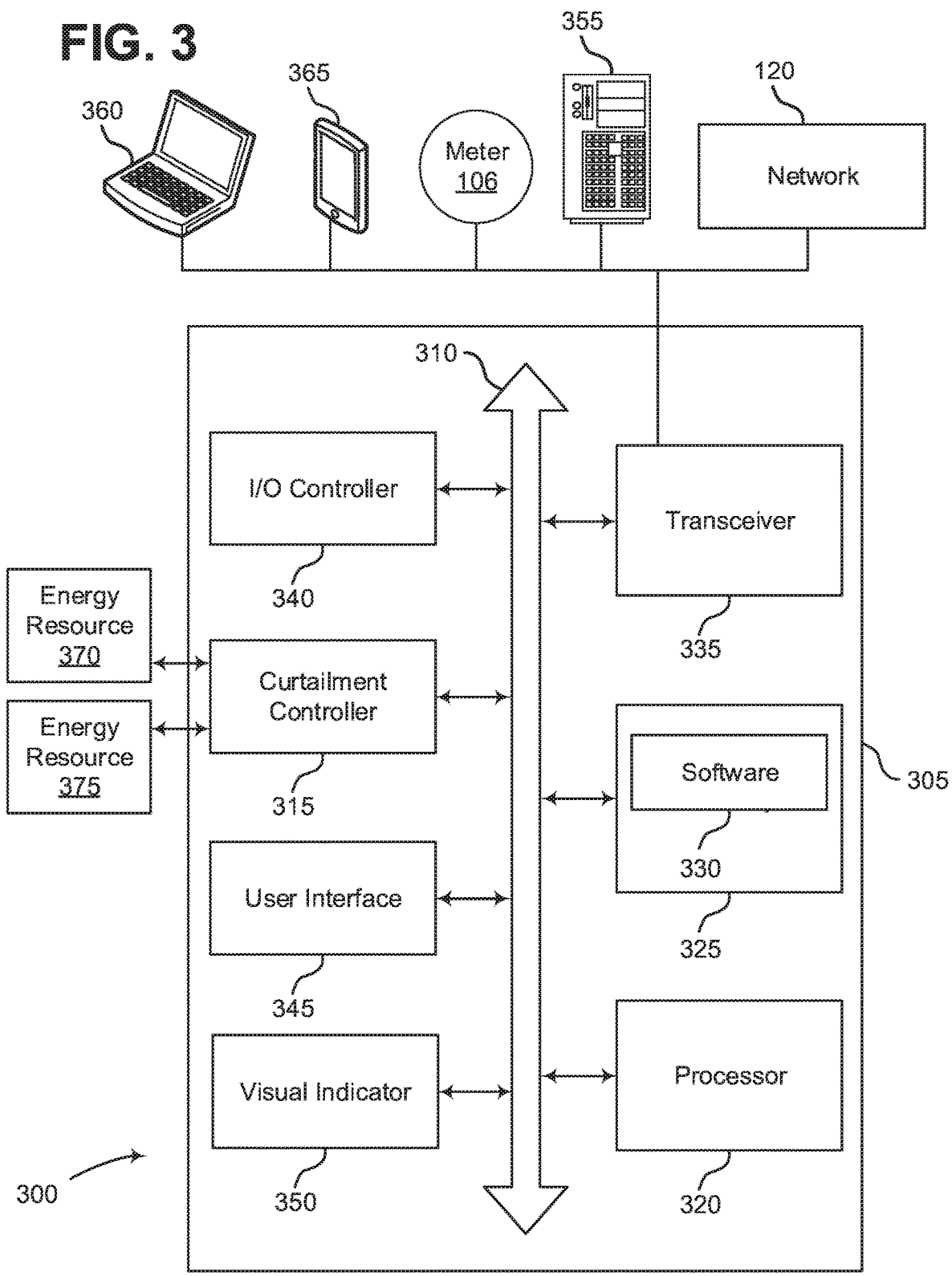
FIG. 3 is a schematic diagram of a system and apparatus that may be used as part of embodiments of the present disclosure.

FIG. 3 shows a diagram of a system 300 including a device 305 that may be used as part of the system controller 114 in accordance with various aspects of the present disclosure. Device 305 may be an example of or include the computing and connective components of the system controller 114, as described above, for example, with reference to FIG. 1. Device 305 may include components for bi-directional data communications including components for transmitting and receiving communications, including curtailment controller 315, processor 320, memory 325, software 330, transceiver 335, I/O controller 340, user interface 345, and visual indicator 350. These components may be in electronic communication via one or more busses (e.g., bus 310).

In some cases, device 305 may communicate with a remote storage device, and/or a remote server (e.g., server 355). For example, one or more elements of device 305 may provide a direct connection to a remote server via a direct network link to the Internet via a POP (point of presence). In some embodiments, one element of device 305 (e.g., one or more antennas, transceivers, etc.) may provide a connection using wireless techniques, including digital cellular telephone connection, Cellular Digital Packet Data (CDPD) connection, digital satellite data connection, and/or another connection.

Many other devices and/or subsystems may be connected to one or may be included as one or more elements of system 300 (e.g., cell radio module, battery, utility equipment monitor, and so on). In some embodiments, all of the elements shown in FIG. 3 need not be present to practice the present systems and methods. The devices and subsystems may also be interconnected in different ways from those shown in FIG. 3. In some embodiments, aspects of the operations of system 300 may be readily known in the art and are not discussed in detail in this disclosure.

The signals associated with system 300 may include wireless communication signals such as radio frequency, electromagnetics, LAN, WAN, VPN, wireless network (using 802.11, for example), 345 MHz, Z-WAVE®, cellular network (using 3G and/or Long Term Evolution (LTE), for example), and/or other signals. The radio access technology (RAT) of system 300 may be related to, but are not limited to, wireless wide area network (WWAN) (GSM, CDMA, and WCDMA), wireless local area network (WLAN) (including BLUETOOTH® and Wi-Fi), WiMAX, antennas for mobile communications, antennas for Wireless Personal Area Network (WPAN) applications (including radio frequency identification devices (RFID) and UWB). In some embodiments, one or more sensors (e.g., current or voltage sensors, ammeters, volt meters, magnetic sensors, and/or other sensors) may be connected to some elements of system 300 via a network using the one or more wired and/or wireless connections.

Processor 320 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 320 may be configured to operate a memory array using a memory controller. In other cases, a memory controller may be integrated into processor 320. Processor 320 may be configured to execute computer-readable instructions stored in a memory to perform various functions (e.g., functions or tasks supporting a device for controlling dispatchable resources).

Memory 325 may include RAM and ROM. The memory 325 may store computer-readable, computer-executable software 330 including instructions that, when executed, cause the processor to perform various functions described herein. In some cases, the memory 325 may contain, among other things, a basic input/output system (BIOS) which may control basic hardware and/or software operation such as the interaction with peripheral components or devices. In some embodiments, the memory 325 may be part of a non-transitory computer-readable medium that is separable from the device 305, such as, for example, a CD-ROM, DVD-ROM, flash memory drive, and other similar data storage devices.

Software 330 may include code to implement aspects of the present disclosure, including code to support operation of a system controller for management of dispatchable electrical resources. Software 330 may be stored in a non-transitory computer-readable medium such as system memory or other memory. In some cases, the software 330 may not be directly executable by the processor but may cause a computer (e.g., when compiled and executed) to perform functions described herein. For example, the software 330 may be configured to perform the methods described in connection with FIGS. 4-6 and other methods described herein.

Transceiver 335 may communicate bi-directionally, via one or more antennas, wired links, or wireless links as described above. For example, the transceiver 335 may represent a wireless transceiver and may communicate bi-directionally with another wireless transceiver. The transceiver 335 may also include a modem to modulate the packets and provide the modulated packets to the antennas for transmission, and to demodulate packets received from the antennas. The transceiver 335 may communicate bi-directionally with external computing devices 360 and 365, remote computing devices (via network 120), one or more utility meter 106, a server 355, one or more building management systems and utility monitoring services, similar devices, or combinations thereof.

I/O controller 340 may manage input and output signals for the device 305. I/O controller 340 may also manage peripherals not integrated into the device 305. In some cases, I/O controller 340 may represent a physical connection or port to an external peripheral. In some cases, I/O controller 340 may utilize an operating system such as iOS®, ANDROID®, MS-DOS®, MS-WINDOWS®, OS/2®, OS-X®, UNIX®, LINUX®, or another known operating system. In other cases, I/O controller 340 may represent or interact with a modem, a keyboard, a mouse, a touchscreen, or a similar device. In some cases, I/O controller 340 may be implemented as part of a processor. In some cases, a user may interact with device 305 via I/O controller 340 or via hardware components controlled by I/O controller 340. In some arrangements, an external computing device 360, 365 may be used to interact with the device 305.

User interface 345 may enable a user to interact with device 305. In some embodiments, the user interface 345 may include an audio device, such as an external speaker system, an external display device such as a display screen, and/or an input device (e.g., remote control device interfaced with the user interface 345 directly and/or through the I/O controller module).

The curtailment controller 315 may provide a connection to dispatchable resources 370, 375 or other controllers. The dispatchable resources 370, 375 may include, for example, generator 126, inverter 118 and energy storage system 116, and inverter 124 and energy storage system 122 and, in some cases, dispatchable resource controllers (e.g., 204, 206, 208). Thus, information about the status characteristics of those components (e.g., their power levels, health characteristics, temperatures, state of charge (SOC), voltage, temperature, cycle count, and other status information) may be communicated to the device 305. The curtailment controller 315 may also provide a control interface with the inverter 118 and energy storage 116 to perform the functions of the device 305 and system controllers described herein.

Figure 4:
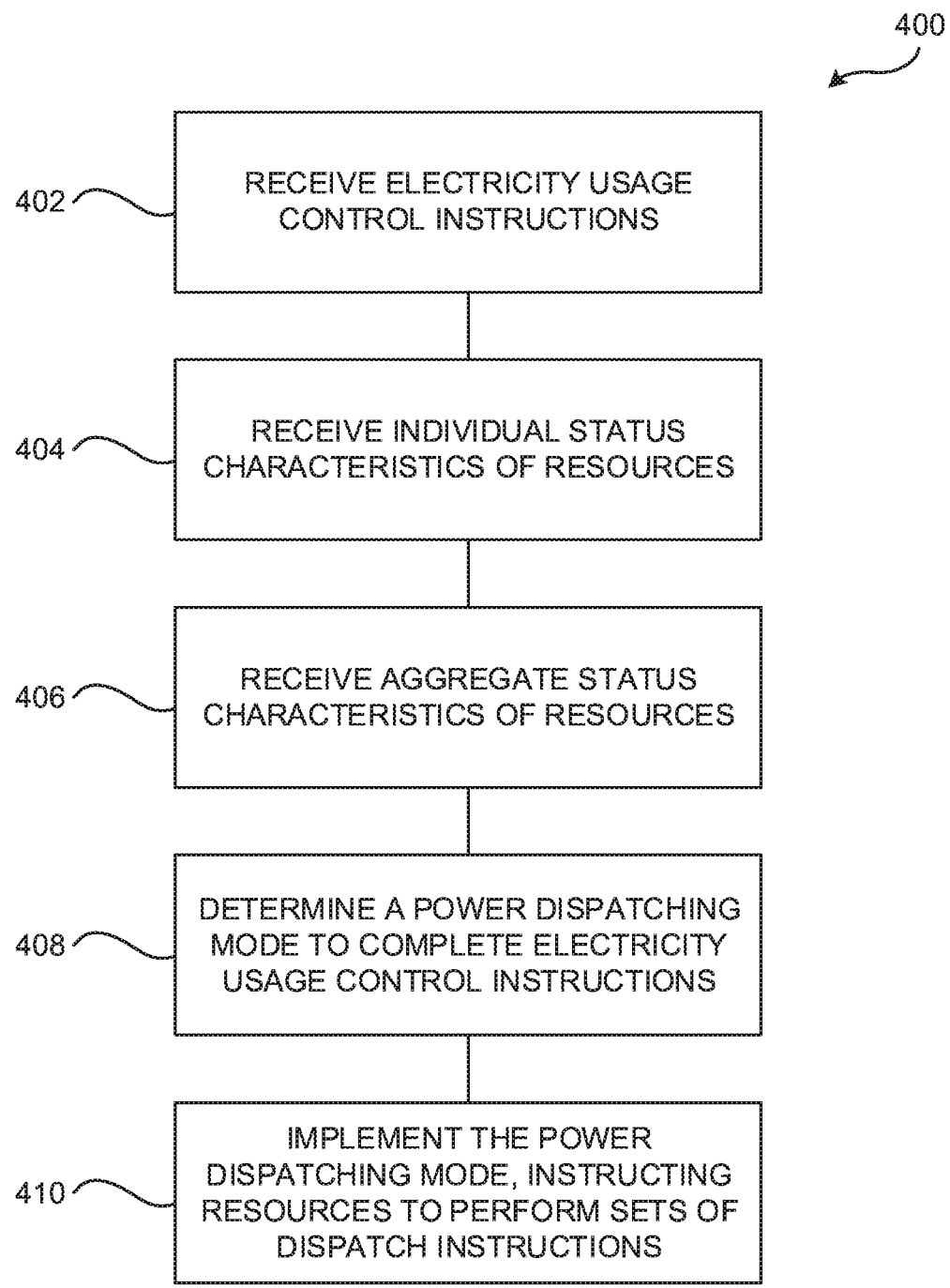
FIG. 4 shows a process chart illustrating a method according to the present disclosure.

FIG. 4 is a process flowchart illustrating an embodiment of the present disclosure. The method 400 shown may be implemented by system controller 114, cluster controller 202, device 305, and other related devices. The method 400 may be performed by receiving electricity usage control instructions, as shown in block 402. The electricity usage control instructions may be received at the site of the energy consumer (e.g., site 100) where a plurality of energy storage resources or other dispatchable electrical resources are located. The electricity usage control instructions may be received via a communications interface, such as, for example, a network connection (e.g., 120), transceiver (e.g., 335), or related device. The electricity usage control instructions may comprise demand response information, demand charge information, and load control information. For example, demand response information may include a request or directions for the customer site to increase or reduce power draw from the utility distribution grid by a specified magnitude (e.g., in kW) and for a specified duration of time (e.g., in hours). Demand charge information may, for example, include a request or directions for the customer site to avoid drawing power above a specified magnitude (e.g., in kW) or for a specified duration of time (e.g., for the remainder of a billing period or a subdivision thereof). Load control information may comprise a request or directions to prevent power from being dispatched from dispatchable electrical resources to certain loads. These instructions may comprise directions to prevent dispatch of energy to loads connected outside a micro-grid to which the dispatchable electrical resources are connected or directions to at least temporarily suppress demand of a certain load by offsetting the demand of that load or shifting its load to be served by the dispatchable electrical resources. Other examples of electricity usage control instructions are discussed elsewhere herein or will be apparent to those having ordinary skill in the art.

The method 400 may further comprise receiving individual status characteristics of each of the plurality of energy storage resources of the energy storage resources at the site, as shown in block 404. The individual status characteristics may comprise electrical, chemical, and physical characteristics of the various resources at the site, such as, for example, current state of charge (SOC) or fuel status, number of cycles, current available capacity or power (e.g., in kWh or kW), total capacity, resource health, age, energy discharged over the device's lifetime (e.g., in MWh), location, connection type, generator or energy storage type, startup speed, temperature, reactive charge power (e.g., in kVAr), real discharge power (e.g., in kVAr), maximum or minimum input or output voltage, efficiency profile information (e.g., percent efficiency versus power), maximum charge or discharge profile (e.g., power versus SOC), sampling period, soft maximum or minimum SOC, and related information. Not all of the status characteristics listed here will apply to all types of dispatchable electrical resources, and not all of the status characteristics listed here are required to be collected.

Figure 5:
FIG. 5 shows a table of status characteristics that may be used in some embodiments of the present disclosure.

The method 400 may also include receiving aggregate status characteristics of the plurality of energy storage resources, as indicated in block 406. The aggregate status characteristics may comprise at least one of a combined total amount of characteristics of the plurality of energy storage resources that can be combined, an overall value of the status characteristics that is weighted by the individual status characteristics, and a value representing the maximum aggregate total of a status characteristic. FIG. 5 shows a table 500 with individual status characteristics matched to their corresponding aggregate status characteristic for many kinds of potential status characteristics.

For instance, an individual status characteristic of the remaining energy capacity (e.g., in kWh) in each of the energy storage systems or generators at the site may correspond with an aggregate status characteristic of the aggregate remaining energy capacity (e.g., in MWh). The aggregate remaining energy capacity may be the sum of all of the remaining energy capacities of the individual resources. Similarly, an individual status characteristic of the maximum real charge power (e.g., in kW), maximum reactive charge power (e.g., in kVAr), maximum real discharge power (e.g., in kW), maximum reactive discharge power (e.g., in kVAr), current real power (e.g., in kW), current reactive power (e.g., in kVAr), lifetime energy discharged (e.g., in MWh), ramp rate (e.g., in kW/s), and number of cycles for each dispatchable resource may respectively correspond with aggregate status characteristics of the maximum aggregate real charge power (e.g., in kW), maximum aggregate reactive charge power (e.g., in kVAr), maximum aggregate real discharge power (e.g., in kW), maximum aggregate reactive discharge power (e.g., in kVAr), aggregate current real power (e.g., in kW), aggregate current reactive power (e.g., in kVAr), aggregate lifetime energy discharged (e.g., in MWh), aggregate ramp rate (e.g., in kW/s), and aggregate number of cycles. In each respective case, the aggregate status characteristic may be represented by the sum of the individual status characteristics.

If the individual status characteristic is the state of charge (e.g., in SOC %) or state of health (e.g., in health %) of each energy storage system at the site, the respective aggregate status characteristic may be an overall weighted state of charge (e.g., in SOC %) or overall weighted state of health (e.g., in health %) of the cluster of all of those energy storage systems. In some embodiments, the overall weighted state of charge or overall weighted state of health may be an average value of each of the individual state of charge or state of health status characteristics. In some configurations, the overall weighted state of charge or overall weighted state of health may be weighted by the overall energy capacity of each of the individual energy storage systems, wherein higher-capacity energy storage systems are more heavily weighted than smaller-capacity energy storage systems. The weighted representation of the overall state of charge or overall state of health may help give a clearer representation of the remaining capacity or current health of the aggregate system when there is a large disparity between the state of charge or health of high- and low-capacity energy storage systems.

In some embodiments, the individual status characteristics may comprise generalized system modes, such as, for example, whether the resource is online, offline, in a fault condition, in startup, ready, or undergoing maintenance or in a maintenance mode. The aggregate status characteristics in that case may be a weighted breakdown of the individual generalized system modes, such as, for example, a weighted representation of what percentage of the resources are offline, in startup, ready, online, and the like.

Figure 6:
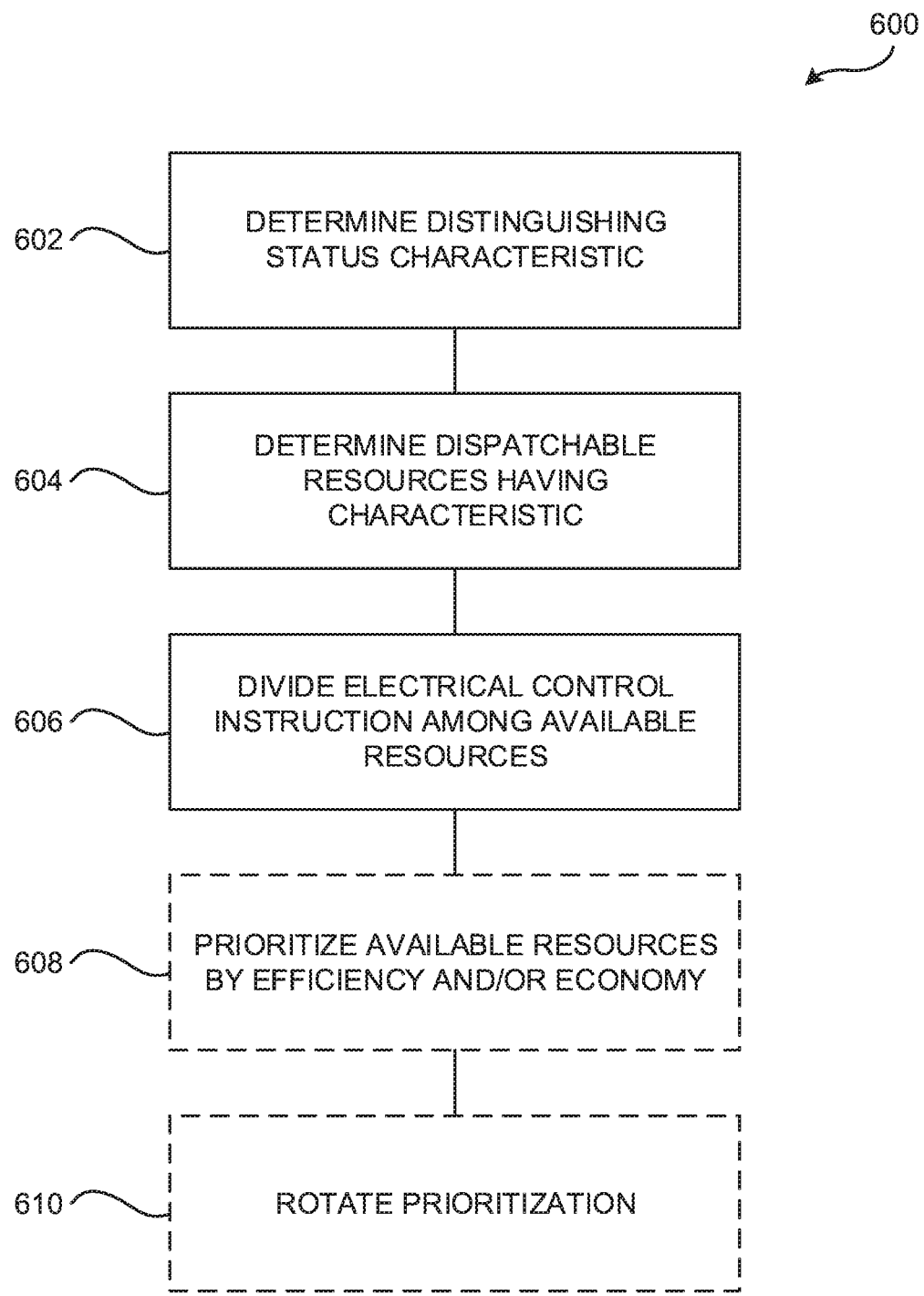
FIG. 6 shows a process chart illustrating another method according to the present disclosure.

Referring again to FIG. 4, the method 400 may determine a power dispatching mode to complete the electricity usage control instructions, as indicated in block 408. Rather than splitting the electricity usage control instructions evenly among all available dispatchable resources without regard to their abilities to fulfill those requests, the power dispatching mode may take into account individual status characteristics of the dispatchable resources in order to more efficiently and effectively provide a response to the electricity usage control instructions. FIG. 6 shows an example process flowchart of steps of a method 600 that may be used to perform this process. Thus, the method 600 may be performed as part of method 400 to determine a power dispatching mode to complete electricity usage control instructions.

A plurality of different dispatching modes may be used. In one embodiment, the dispatching mode comprises evenly distributing the electricity usage control instructions among the dispatchable resources that are within a certain category or that have a certain status. This may require determining a distinguishing status characteristic of the resources, as shown in block 602, and determining which dispatchable resources have that characteristic, as shown in block 604. The instructions may then be divided up among the resources having that characteristic, as shown in block 606. For example, the electricity usage control instructions may be evenly divided in order to be provided to all of the dispatchable resources having that status or within the category (e.g., all of the resources that are currently online or have a SOC above 50%). "Dividing" the instructions may comprise generating sets of dispatch instructions for each of the resources that will collectively fulfill the electricity usage control instructions or generating a set of dispatch instructions that upon execution will cause each of the resources to fulfill a portion of the electricity usage control instructions. The power or energy provided from each of those resources may be expressed as the total power or energy required to fulfill the electricity usage control instructions divided by the number of resources within the certain category or having the particular status.

In another embodiment, the dispatching mode may comprise a weighted distribution of the electricity usage control instructions among the dispatchable resources that are within a certain category or that have a certain status. This may be performed as part of block 606. For example, the electricity usage control instructions may be multiplied or divided by a weighting factor for each dispatchable resource when provided to all of the dispatchable resources having the status or that are within the category. The weighting factor may be one of the individual status characteristics such as the maximum charge or discharge power of the dispatchable resources. In one example, the power or energy provided from each of those resources may be expressed as the total discharge power or energy required to fulfill the electricity usage control instructions multiplied by the maximum discharge power of the dispatchable resource divided by the aggregate maximum discharge power of all of the dispatchable resources in the category or having the certain status. In some arrangements, the individual status characteristics other than the maximum discharge power and aggregate status characteristics other than the aggregate maximum discharge power may also be used.

In yet another embodiment, the dispatching mode may comprise designating clusters or groups of dispatchable resources with different levels of priority, then distributing apportioned, prioritized electricity usage control instructions to the dispatchable resources, as indicated in block 608. For example, the method 400 may comprise organizing at least two groups of dispatchable resources based on their individual status characteristics (e.g., one group having a state of charge over 50% and one group having a state of charge at or below 50%), assigning the groups a priority level (e.g., the high-SOC group having higher priority than the low-SOC group), and then distributing the electricity usage control instructions to the highest priority group. If the highest priority group is not able to fulfill the electricity usage control instructions alone (e.g., the first group would deplete fuel or fall below a threshold SOC before complete fulfillment), then the next priority group is given at least a portion or surplus amount of the electricity usage control instructions required to fulfill the instructions from the next group. This dispatching mode may allow one or more groups to be used up before other groups of dispatchable resources or may allow highly-prioritized groups to be used more heavily or repetitively than lower-prioritized groups. Using this dispatching mode may be beneficial when certain dispatchable resources are more efficient at performing certain tasks in the electricity usage control instructions, and they can be therefore be used to their highest potential while still having less-efficient resources available as "backup" or "spill-over" capacity. In some embodiments, for n different levels of priority:

while $\Sigma^x_{i=1} P_{DR(i)} < P_{AGG}$ where $x<n$: $P_{DR(x+1)} = \min(\text{MaxP}_{DR}, P_{AGG} - \Sigma x_{i=1} P_{DR(i)})$, wherein $P_{DR(i)}$ represents the electricity usage control instruction divided among all dispatchable resources of priority level i, $P_{AGG}$ represents the total electricity usage control instruction, and $\text{MaxP}_{DR}$ is the maximum output of all dispatchable resources in a priority level.

In another embodiment, the dispatch mode may be a prioritized mode, as described above, but the groups or different lists of priority may be rotated over time or in response to other milestones being reached, as indicated in block 610. Thus, the priority of the groups of dispatchable resources may be changed, for example, after time intervals, cycle counts, certain amounts of energy are discharged, or other individual status characteristics are reached. If one group of resources is used frequently because it is at the highest priority level, thereby causing the cycle count of the resources in the group to rise quickly, it may be lowered in priority relative to another group of resources when a certain cycle count is reached. If one group has high temperature due to working more often than others, those resources in that group may be lowered in priority to allow them to cool. This shifting prioritization mode may thereby reduce wear and tear on particular groups of resources and may help preserve overall system health and working life.

In yet another embodiment, the dispatch mode may optimize use of dispatchable resources for increased efficiency and balanced degradation, as indicated by block 608. For instance, the method 400 may be adapted to manage dispatchable resources such as generators and sheddable loads in addition to energy storage systems and related resources, and each of the different types of dispatchable resources may be operated to fulfill electricity usage control instructions with technology-specific efficiency and in view of technology-specific limitations (e.g., generators would not be able to draw power from the grid or HVAC sheddable loads would require planned consumption "snap-back" if shed during certain times or under certain weather conditions). Thus, the method 400 may optimize the dispatchable resources by checking the long-term effects of using the energy storage, generation, and sheddable resources to fulfill the electricity usage control instructions before assigning any of the resources a particular set of dispatch instructions. In some cases, the use of the dispatchable resources may be optimized based on a time series projection of maximum power limits, ramp rates, and other status characteristics to better inform the dispatchable resource controllers of what will be available if a dispatchable resource is operated a certain way for an extended period of time. The power dispatching mode may prepare dispatch instructions that are capable of being performed by the dispatchable resources to which they are sent rather than preparing dispatch instructions that are sent to dispatchable resources that are not capable of performing the instructions (e.g., sending instructions to a depleted ESS to discharge or sending instructions to a generator to charge). In additional embodiments, the dispatching mode may comprise a setting to control (e.g., shed) non-critical load in micro-grid applications for demand-response-like operation of that load. Individual sets of dispatch instructions in these embodiments may be determined by maximizing resource efficiency after considering the efficiency profiles, maximum power limits, ramp rates, and remaining energy capacities of each resource.

Referring again to FIG. 4, upon determining a power dispatching mode in block 408 (such as by using method 600), the method 400 may further comprise implementing the power dispatching mode by instructing the dispatchable resources to perform sets of dispatch instructions, wherein there are multiple sets of dispatch instructions that correspond to respective multiple sets of dispatchable resources, as indicated in block 410. The sets of instructions may, in the aggregate, fulfill the electricity usage control instructions according to the selected power dispatching mode. For example, a first set of dispatchable resources (e.g., a set of high-SOC energy storage devices) may receive a first set of dispatch instructions (e.g., discharge at 2 kW), and a different, second set of dispatchable resources (e.g., a set of low-SOC energy storage devices) may receive a second set of dispatch instructions (e.g., discharge at 0.5 kW). At least one set of dispatch instructions may be sent to each dispatchable resource that is required to take action in the power dispatching mode. The sets of dispatch instructions may be sent via a wired or wireless connection to the dispatchable resources (e.g., via a curtailment controller 315 or transceiver 335). The dispatchable resources may then go on to execute the dispatch instructions, such as, for example, by providing power to the site, turning off, or drawing power from the grid upon receiving the dispatch instructions.

In some embodiments, other dispatching modes of operation may be implemented in which the method 400 may comprise determining how to complete the electricity usage control instructions so as to attempt to achieve desired objectives. In some cases, the desired objectives may be carried out by assigning prioritization to the dispatchable resources, as explained above, in a manner consistent with those objectives. The objectives may comprise maximizing cost efficiency or health efficiency of the dispatchable resources, maximizing power output (in charging or discharging) from the dispatchable resources, maximizing discharge power output, maximizing charging power output, maximizing the amount of charging done by solar generators or other renewable energy sources, prioritizing critical loads over other loads, maximizing short-term power output, and preserving backup capacity of the dispatchable resources, as explained below.

If the desired objective is to maximize cost efficiency or maximize health efficiency, those metrics of the dispatchable resources are preserved, even at the expense of other metrics. Dispatch operations and instructions under this objective may be different from other modes since, for example, in some cases operating at a higher efficiency may come at the cost of reduced maximum power output, depletion of reserve energy, or reduced health of the dispatchable resources being used. This type of dispatch mode may be beneficial for utility customers that are evaluated by utility providers at an annual energy basis.

If the desired objective is to maximize power, the system may attempt to optimize dispatch instructions so that both short-term discharge power capacity and charge power capacity are preserved over any other metrics. For example, if certain dispatchable resources have significant power limitations at extreme states of charge, the controller may attempt to keep those assets at about 50% SOC (or another SOC close to 50%) in order to maximize their flexibility in being able to charge or discharge when electricity usage control instructions fluctuate. Said another way, the system may provide dispatch instructions that preserve the dispatchable resources' ability to selectively charge or discharge when needed. This type of dispatch mode may be beneficial when the customer is providing ancillary service, such as by participating in a frequency response program.

If the desired objective is to maximize discharge capacity, the system may attempt to optimize dispatch instructions so that discharge power capacity is preserved over any other metrics. For example, the system may prioritize use of resources with a lower maximum discharge power before using higher maximum discharge power resources. If the dispatchable resources comprise an array of batteries and an array of capacitors, the system may prioritize use of the energy stored in the batteries (which would have lower maximum power output) so that the capacitors (with higher maximum power output) would stand ready to respond to new electricity usage control instructions, if needed, as long as possible. This mode may be beneficial for customers optimizing their system for peak shaving or during a frequency regulation up period.

Similarly, if the desired objective is to maximize charge capacity, the system may attempt to optimize dispatch instructions so that the charge power capacity is preserved over any other metrics. For example, the system may prioritize the use of resources with lower maximum charge power over resources with a higher maximum charge power. This mode may be beneficially used when there is expected to be a high probability of surplus energy for charging, such as during a solar generator's peak production period or during a frequency regulation down period.

If the desired objective is charging from a particular generator or other resource, such as solar charging or charging by other renewable resources, the system may set parameters that cause resources to charge only when the particular generator or other resource is currently producing power. For example, the system may prevent the state of charge of certain energy storage systems from getting high enough that it would limit the amount of charging that they could do when the particular generator is producing power. This may be beneficial when customers are participating in programs such as the investment tax credit (ITC) program that requires storage to be at least 75% charged by renewable (e.g., solar) resources and other comparable programs.

In cases where the desired objective is prioritizing critical loads, the system may enable a mode where dispatch instructions prevent consumption by non-critical loads (e.g., loads outside a micro-grid or energy storage systems that do not need to recharge immediately) so that critical loads can remain online. When the desired objective is maximizing short-term power, the system may be configured to limit short-term consumption of loads for a period of time and then allowing the loads to consume more energy at a later time, even if it produces a "snap-back" peak in consumption when they consume at the later time. For instance, the system may shed consumption from an HVAC system (e.g., by increasing the thermostat) for a short period of time to maximize the amount of power available to other loads at the site during a critical time period, then the system may allow the HVAC system to reset its thermostat at a later time, even if a peak in demand occurs at that time as a result. This may be used, for example, when the cost of immediate consumption is greater than the cost of delayed consumption.

Finally, if the operating mode is to prioritize preservation of backup energy, the system may provide dispatch instructions that set a lower limit on the amount of discharge possible from certain energy storage systems at the site. If the lower limit is reached by a particular energy storage resource, the priority of using that resource may drop in favor of using energy from resources that still have excess stored energy. In this manner, the system may ensure that a certain portion of the energy (e.g., a particular percent SOC or kilowatt-hour value) will be available for backup or other reserved purposes.

Thus, in various embodiments, one or more operating modes may be implemented to preserve loads or capacities of the dispatchable electrical resources at the site. These operating modes may be implemented when dividing electricity usage control instructions, such as in block 606 of method 600 or when determining and implementing a power dispatching mode in blocks 408 and 410 of method 400.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

What is claimed is:

1. A method of providing a response to electricity usage control instructions, the method comprising:
    receiving an electricity usage control instruction;
    determining a status characteristic for each of a plurality of dispatchable electrical resources, each of the plurality of dispatchable resources configured to supply electrical power to a utility distribution grid and receive electrical power from the utility distribution grid, the status characteristic of each dispatchable electrical resource comprising a cost efficiency of supplying power to the utility distribution grid from the dispatchable electrical resource; and
    dividing the electricity usage control instruction into a plurality of electricity control instructions for the plurality of dispatchable electrical resources based on the status characteristics of each dispatchable electrical resource, wherein dividing the electricity usage control instruction into the plurality of electricity control instructions comprises prioritizing dispatching a first set of the plurality of dispatchable electrical resources over a second set of the plurality of dispatchable electrical resources, wherein the first set is prioritized in discharge magnitude over the second set.

2. The method of claim 1, wherein priority of the first and second sets is rotated over time.

3. The method of claim 2, wherein priority is rotated based on a change to the status characteristic.

4. The method of claim 1, wherein the first set is chronologically prioritized over the second set.

5. The method of claim 1, further comprising generating a time series projection of the status characteristics, wherein dividing the electricity usage control instruction comprises comparing the time series projection of the status characteristics for at least two dispatchable electrical resources of the plurality of dispatchable electrical resources.

6. The method of claim 1, wherein the electricity usage control instruction is divided evenly among dispatchable electrical resources having status characteristics exceeding a threshold value.

7. The method of claim 1, wherein the electricity usage control instruction is divided evenly among dispatchable electrical resources having status characteristics within a non-numeric category.

8. The method of claim 1, wherein the electricity usage control instruction is divided proportionally to the status characteristics of the plurality of dispatchable electrical resources.

9. A method of providing a response to electricity usage control instructions, the method comprising:
    receiving an electricity usage control instruction;
    determining a status characteristic for each of a plurality of dispatchable electrical resources, each of the plurality of dispatchable resources configured to supply electrical power to a utility distribution grid and receive electrical power from the utility distribution grid, the status characteristic of each dispatchable electrical resource comprising a cost efficiency of receiving power from the utility distribution grid to the dispatchable electrical resource; and
    dividing the electricity usage control instruction into a plurality of electricity control instructions for the plurality of dispatchable electrical resources based on the status characteristics of each dispatchable electrical resource, wherein the electricity usage control instruction is divided proportionally to the status characteristics of the plurality of dispatchable electrical resources.

10. The method of claim 9, wherein dividing the electricity usage control instruction comprises prioritizing dispatching a first set of the plurality of dispatchable electrical resources over a second set of the plurality of dispatchable electrical resources.

11. The method of claim 10, wherein priority of the first and second sets is rotated over time.

12. The method of claim 11, wherein priority is rotated based on a change to the status characteristic.

13. The method of claim 10, wherein the first set is chronologically prioritized over the second set.

14. The method of claim 9, further comprising generating a time series projection of the status characteristics, wherein dividing the electricity usage control instruction comprises comparing the time series projection of the status characteristics for at least two dispatchable electrical resources of the plurality of dispatchable electrical resources.

15. The method of claim 9, wherein the electricity usage control instruction is divided evenly among dispatchable electrical resources having status characteristics exceeding a threshold value.

16. The method of claim 9, wherein the electricity usage control instruction is divided evenly among dispatchable electrical resources having status characteristics within a non-numeric category.

17. A method of providing a response to electricity usage control instructions, the method comprising:
    receiving an electricity usage control instruction;
    determining a status characteristic for each of a plurality of dispatchable electrical resources, each of the plurality of dispatchable resources configured to supply electrical power to a utility distribution grid and receive electrical power from the utility distribution grid, the status characteristic of each dispatchable electrical resource comprising a cost efficiency of supplying power to the utility distribution grid from the dispatchable electrical resource; and
    dividing the electricity usage control instruction into a plurality of electricity control instructions for the plurality of dispatchable electrical resources based on the status characteristics of each dispatchable electrical resource;
    wherein dividing the electricity usage control instruction into the plurality of electricity control instructions comprises prioritizing dispatching a first set of the plurality of dispatchable electrical resources over a second set of the plurality of dispatchable electrical resources;
    wherein the first set is prioritized in discharge magnitude over the second set;
    wherein prioritizing dispatching the first set over the second set includes dispatching the first set for a different duration of time then the second set; and
    wherein the electricity usage control instruction is divided proportionally to the status characteristics of the plurality of dispatchable electrical resources.

* * * * *